(12) United States Patent
Zortea

(10) Patent No.: US 6,829,309 B1
(45) Date of Patent: Dec. 7, 2004

(54) PHASE DETECTOR FOR BAUD RATE-SAMPLED MULTI-STATE SIGNAL RECEIVER

(75) Inventor: Anthony Eugene Zortea, Pipersville, PA (US)

(73) Assignee: 3Com Corporation, Santa Clara, CA (US)

(*) Notice: Subject to any disclaimer, the term of this patent is extended or adjusted under 35 U.S.C. 154(b) by 809 days.

(21) Appl. No.: 09/777,080

(22) Filed: Feb. 5, 2001

(51) Int. Cl.$^7$ .............................................. H04L 7/33
(52) U.S. Cl. ...................... 375/294; 375/360; 375/376; 327/155; 327/233; 331/25
(58) Field of Search ................................ 375/293, 294, 375/359, 360, 373, 376; 327/155, 233; 331/25

(56) References Cited

U.S. PATENT DOCUMENTS

| | | | | | |
|---|---|---|---|---|---|
| 5,121,411 | A | * | 6/1992 | Fluharty | ................ 375/293 |
| 5,872,819 | A | * | 2/1999 | Carsello et al. | ............. 375/355 |
| 6,127,897 | A | * | 10/2000 | Sasaki | ........................ 331/25 |

OTHER PUBLICATIONS

U.S. Appl. No. 09/636,047, Zortea et al., filed Aug. 10, 2000.
U.S. Appl. No. 09/636,042, Zortea et al., filed Aug. 10, 2000.

* cited by examiner

Primary Examiner—Amanda T. Le
(74) Attorney, Agent, or Firm—Michaelson & Associates; Peter L. Michaelson

(57) ABSTRACT

The invention is related to analog to digital conversion of a multi-level analog signal at a very low sampling rate. The analog signal is sampled by a recovered clock to produce a succession of samples of the analog signal. The low sampling rate may be within an order of magnitude of the symbol rate of the analog signal. Each sample is converted to a digital word. A phase detector reference circuit determines from peak values of the analog signal at least two allowable levels of the analog signal including a reference-crossing level. The phase detector defines a zero band of amplitude ranges of the analog signal including the reference-crossing level. It further defines an error band of amplitude ranges of the analog signal extending from said zero band to a fraction of the amplitude of the next allowable level. The phase detector then infers either a positive or negative phase error for each pair of successive samples of the analog signal. If the current and prior samples fall within the error and zero bands respectively, a negative phase error is inferred. If the current and prior samples fall within the zero and error bands respectively, a positive phase error is inferred. The phase error is used in a control feedback loop to adjust the recovered clock.

44 Claims, 4 Drawing Sheets

PHASE DETECTOR FOR BAUD RATE-SAMPLED MULTI-STATE SIGNAL RECEIVER

BACKGROUND OF THE INVENTION

1. Technical Field

The invention is related to signal processing of a received multi-state signal such as a pulse amplitude modulated signal, and in particular to phase detection as part of the clock recovery of such a signal using a very low sampling rate such as the baud rate of the signal.

2. Background Art

In a serial data communication channel, the clock is embedded in the data or information (rather than being transmitted as a separate signal in parallel with the data). Therefore, a receiver must recover the transmitter's clock from the data-containing signal in order to process the data. Typically, this means that the receiver must be able to discern each edge in a pulse amplitude modulated signal (for example), compare it to the edge of a locally generated clock, and use this comparison, or "phase detection", to adjust the local clock, until the local clock is frequency locked to the transmitter's clock and the phase of the local clock is optimally positioned so as to minimize the errors in recovering the data. When a DSP receiver is used, the most straight-forward way to ensure that this can happen is for the receiver to sample the received signal at a sampling rate much higher than the frequency of the transmitter's clock. In this way, the receiver can closely observe the zero-crossing time of each edge in the received signal, accurately perform phase detection with that zero-crossing and the phase of the local clock using conventional techniques, adjust the local clock, and thereby recover the exact frequency and phase of the transmitter's clock. Of course, such a high sampling rate (e.g., 5 or 10 times the baud rate of the received signal) is a luxury that a competitive system cannot easily afford. This is because, at least in part, the power consumption of the receiver increases with the sampling rate. Therefore, it would be desirable to reduce the sampling rate, but such a reduction would seem to entail a loss of accuracy in the determination of the zero-crossing of each edge. Such a loss of accuracy leads to clock recovery failure and therefore general failure-of the receiver.

Assuming such difficulties can be overcome, it would be desirable to sample a pulse amplitude modulated signal at a rate the same as or not significantly exceeding the symbol (baud) rate of the received signal. This may be thought of as sampling once per edge. It would be further desirable to be able to do this with a multi-state signal (e.g., a pulse amplitude modulated signal) which is allowed to change from any one of its allowed levels to any other allowed level within one clock period.

SUMMARY OF THE INVENTION

The invention is related to analog to digital conversion of a multi-level analog signal at a very low sampling rate. The analog signal is sampled by a local clock (the "recovered" clock) to produce a succession of samples of the analog signal. These samples themselves are used to adjust the phase and frequency of the local clock in a feedback loop known as "clock recovery." Part of any clock recovery feedback loop is a phase detector that detects the difference in phase between the local clock and the clock that transmitted the signal that is being sampled. The low sampling rate may be within an order of magnitude of the symbol rate of the analog signal. Each sample is converted to a digital word. A phase detector reference circuit determines from peak values of the analog signal at least two allowable levels of the analog signal including a reference-crossing level. The phase detector defines a zero band of amplitude ranges of the analog signal including the reference-crossing level. It further defines an error band of amplitude ranges of the analog signal extending from said zero band to a fraction of the amplitude of the next allowable level. The phase detector then infers either a positive or negative phase error for each pair of successive samples of the analog signal. If the current and prior samples fall within the error and zero bands respectively, a negative phase error is inferred. If the current and prior samples fall within the zero and error bands respectively, a positive phase error is inferred. For any other values of the current and prior samples, the phase error is unknown.

A negative or positive phase error causes a phase correction feedback control loop to adjust the recovered clock. If the recovered clock is being generated by means of selecting a phase of a local clock, known to be very close in frequency to the far end transmitter clock, then the phase correction feedback control loop is used to increment or decrement the phase of the local clock. If the recovered clock is being generated by means of adjusting a local VCO, then the phase correction feedback control loop is used to adjust the voltage on the VCO.

Typically, there are three allowable levels determined by the determining step symmetrically disposed about zero amplitude. In-one embodiment, the phase detector takes the absolute value of each of the samples, whereby the pair of successive samples are absolute values of the digitized analog signal. The reference crossing level is zero amplitude and is a zero-crossing level.

The invention relies upon the randomness of the received signal in that no determination or correction of phase error is made if neither or both of the pair of samples are in the error band, since this condition will obtain sporadically and not continuously.

DETAILED DESCRIPTION OF THE INVENTION

1. Prior Phase Detection Schemes

As employed herein, the term baud rate sampling refers to analog-to-digital conversion carried out at a sampling rate equal to the symbol or "baud" rate of the signal. Essentially, this usually entails sampling at most once for every possible edge in the signal. For certain types of multi-state signals, phase detection using baud rate sampling of the received signal has been demonstrated. Specifically, it has been demonstrated for three-level pulse amplitude modulated signals in which only one-way transitions between the two extreme levels are permitted, such as the MLT3 signal in Fast Ethernet.

Figure 1:
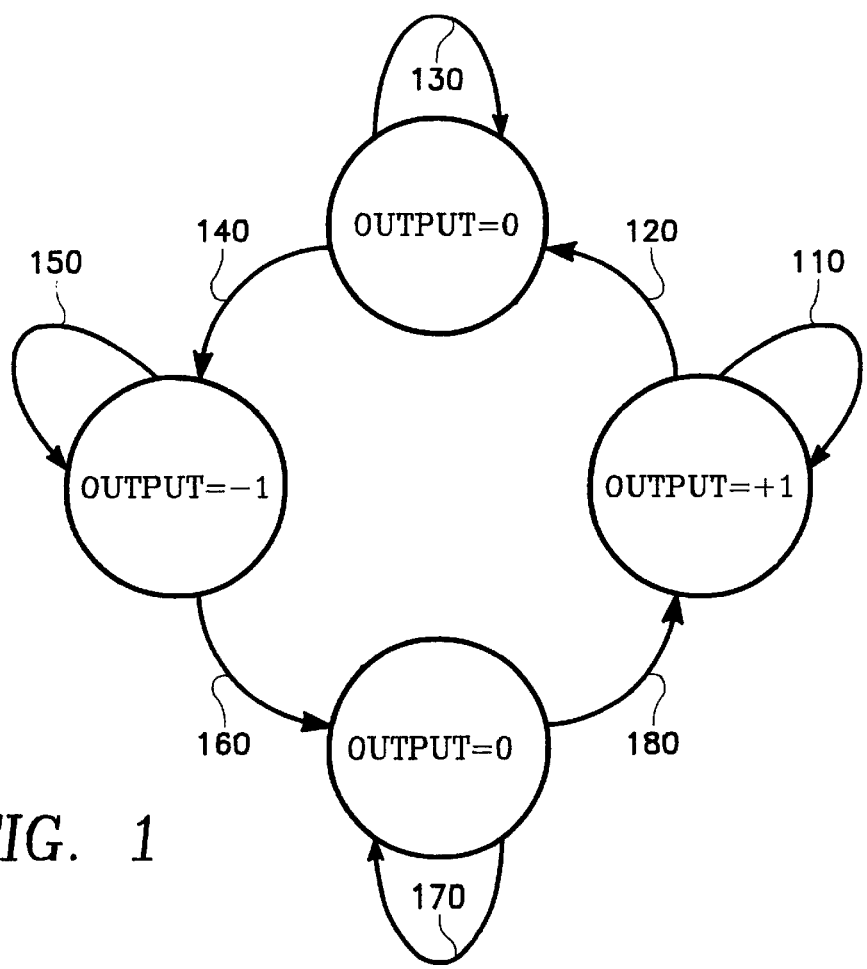
FIG. 1 is a state diagram of a multi-level signal of the prior art having rules restricting transitions.

A state diagram of such a signal is illustrated in FIG. 1. In FIG. 1, there are three valid levels (also referred to herein as "states" or "outputs") of the pulse amplitude modulated signal, namely +1, 0 and −1. In FIG. 1, the +1 level may be repeated (branch 110) or may transition to the 0 level (branch 120). From there, the signal may either repeat the 0 level (branch 130) or may transition to the −1 level (branch 140). The −1 level may be repeated (branch 150) or the signal may transition to the 0 level (branch 160). From there, the signal may repeat the 0 level (branch 170) or may transition to the +1 level (branch 180).

Figure 2:
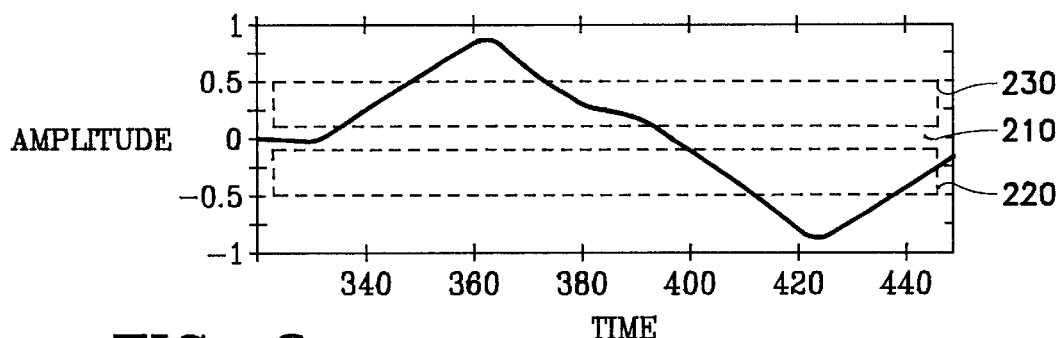
FIG. 2 is a time domain graph illustrating a method of the prior art for detecting phase error using baud rate sampling of the signal of FIG. 1.

FIG. 2 illustrates a time domain waveform of the signal of FIG. 1. The analog waveform of FIG. 2 includes about 3 bauds or symbols, namely a +1 centered around time 365, a 0 centered around time 400 and a −1 centered around time 430. The time axis of FIG. 2 is arbitrarily divided into 32 units per baud. Since the goal here is to employ baud rate sampling, there is only one sample of the signal taken for the 0 centered around time 400. The phase error is deduced from this single sample as follows. Initially, the vertical axis is divided into three regions, depending upon the three valid signal levels. If for example the valid levels are +1, 0 and −1 amplitudes, then a zero phase error region is established in the neighborhood of 0 amplitude. This corresponds to a sample taken at the zero crossing of the signal, which would be a recovered clock with zero error. For example, the zero phase error region 210 may be defined between +0.125 and −0.125 amplitudes. A positive phase error region 220 is defined from −0.125 to −0.5 amplitude and a negative phase error region 230 is defined from +0.125 to +0.5 amplitude. If the sample falls within the positive phase error region, then a positive phase error is inferred and the phase of the "recovered" clock is decremented or decreased. If the sample falls within the negative phase error region, then a negative phase error is inferred and the phase of the "recovered" clock is incremented or increased. If the sample falls within the zero phase error region, no error is inferred and no correction is made to the recovered clock phase.

Figure 3:
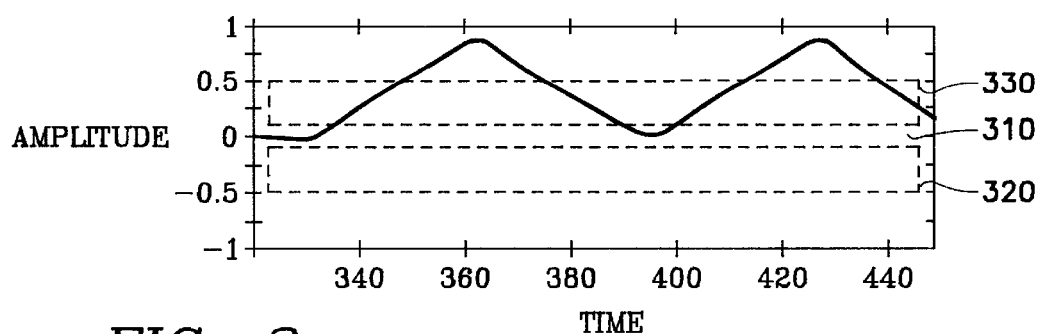
FIG. 3 is a time domain graph illustrating a multi-level signal without any rules restricting transitions.

The difficulty arises when baud rate sampling is attempted with a multi-state or multi-level signal that is not subject to transition rules or restrictions like those of FIG. 1. For example, a more general multi-level signal may be permitted to make transitions between any two levels during any clock period without regard to prior transitions. In such a case, it is impossible to apply the scheme of FIG. 2 without encountering anomalies in interpreting the phase error. Such an attempt is illustrated in FIG. 3. Since the signal may have positive-going or negative-going edges after any zero-crossing, an attempt to simplify the situation is made by taking the absolute value of the received signal in FIG. 3. The problem is that because of the unpredictability of the signal's transition sequence, it is impossible to assign a particular amplitude range (such as the ranges 310, 320 and 330 corresponding to the regions 210, 220, 230 of FIG. 2) to a particular polarity of phase error (positive, negative or zero) as could be done in the case of FIG. 2.

Figure 4:
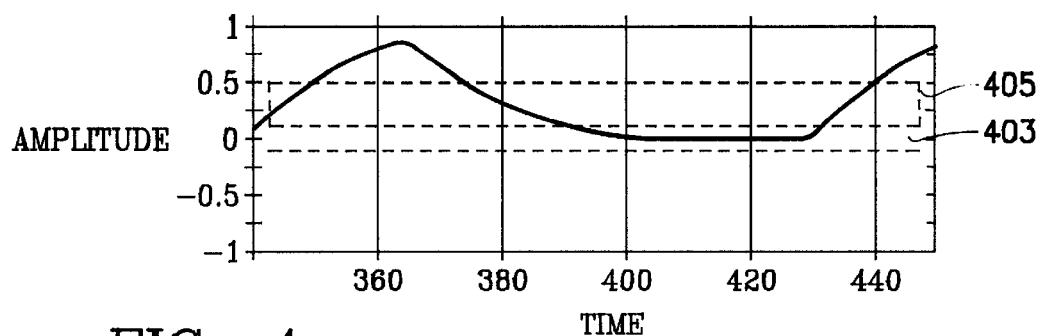
FIG. 4 is a time domain graph illustrating how phase error is detected with baud rate sampling of the signal of FIG. 3.

The problem is overcome in the invention by looking not at the mere state amplitude of the current sample but instead by looking at the transition history of the two most recent samples. Specifically, as illustrated in FIG. 4, the signal amplitude range for the absolute value of the signal is divided into a zero band 403 and an error band 405. In the-present example in which there are three allowed levels (+1, −1 and 0), the zero band may be defined as being between about 0 and +0.1, while the error band may be defined as being between about +0.1 and +0.5. Two transitions of the pair of most recent samples are recognized. One recognized transition is one in which the current sample lies in the error band and the previous sample lies in the zero band. For this transition, a positive phase error is inferred. The other recognized transition is one in which the current sample lies in the zero band and the previous sample lies in the error band. For this latter transition, a negative phase error is inferred. Of course, if a negative phase error is inferred the recovered clock phase is incremented while if a positive phase error is inferred the recovered clock phase is decremented. A significant feature of the invention is that not all transitions are recognized. If for example if both samples are in the zero band, no determination of phase error is attempted. Moreover, if neither sample is in the zero band, then no determination of phase error is attempted. The invention relies upon the randomness inherent in the data signal to render highly unlikely a long repeated continuous string of unrecognized transitions from preventing frequent correction of the recovered clock phase. The randomness of the data virtually guarantees the frequent occurrence of the two recognized transitions to ensure continuous correction and control of the recovered clock phase.

FIG. 4 illustrates a time domain waveform of the absolute value of a 3-level pulse amplitude modulated signal with no transition restrictions. In one case, the first sample may occur at about time 380 and the next sample at time about 410, so that the two samples occur within the error band and within the zero band, respectively. In this case, a negative phase error is inferred. In a different case, the first sample may occur at about time 400 and the next sample at about time 430, so that the two samples occur within the zero band and within the error band, respectively. In this case, a positive phase error is inferred.

Figure 5:
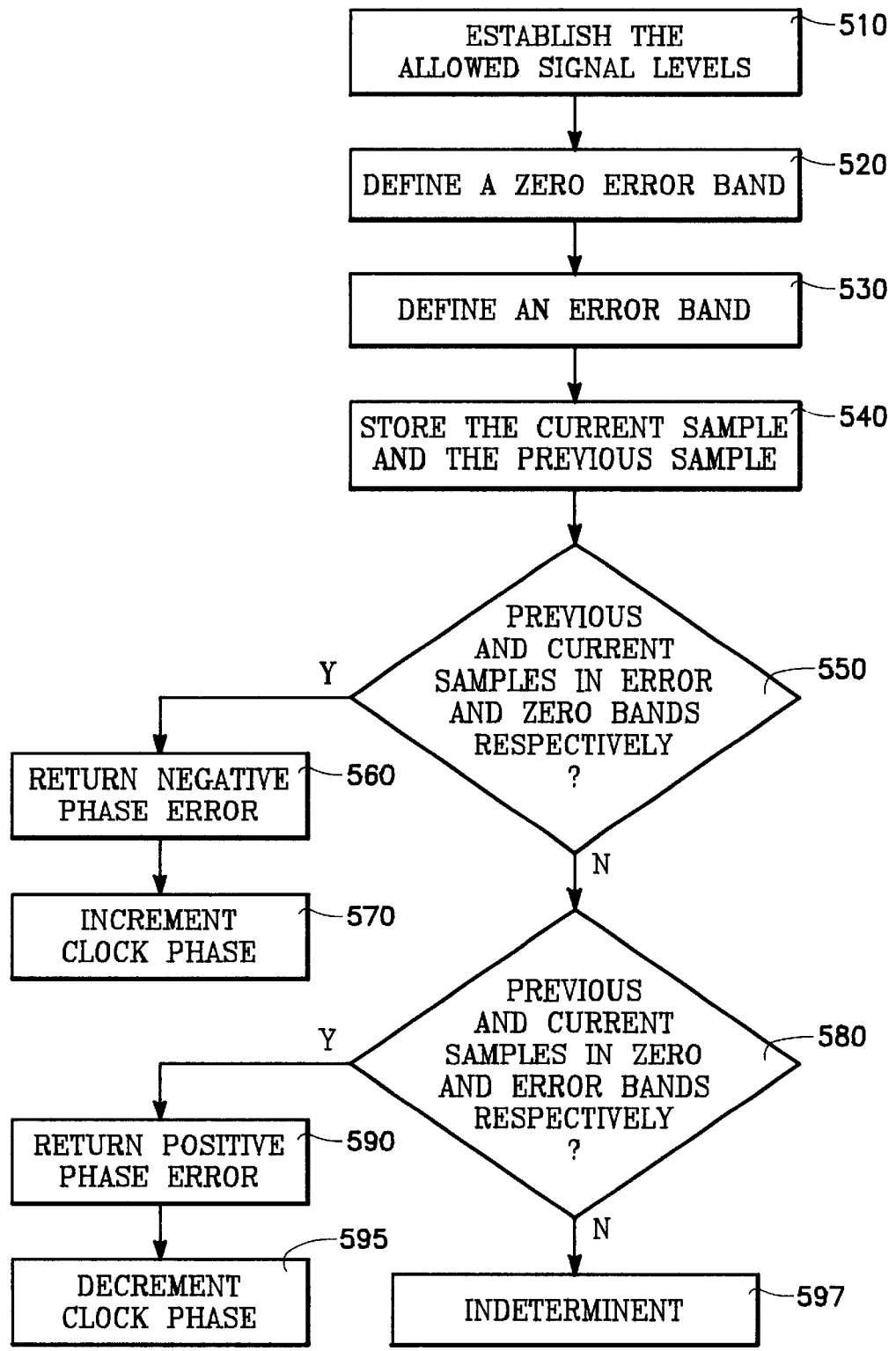
FIG. 5 is a diagram illustrating of the operation of the phase detector embodying the invention.

FIG. 5 illustrates the phase detection process of the invention. First, the allowed signal levels are detected (block 510 of FIG. 5). Next, a zero error band is defined near the signal zero crossing amplitude (block 520). Then, an error band is defined above the zero band (block 530). The current and previous sample amplitudes are stored for the current clock period (block 540). A determination is then made whether the pair of samples occurred in the error and zero bands in that order (block 550). If so, a negative phase error is returned (block 560) and the recovered clock phase is incremented or increased(block 570). Otherwise, a determination is made whether the pair of samples occurred in the zero and error bands in that order (block 580) and if so a positive phase error is returned (block 590) and the recovered clock phase is decremented or decreased(block 595). Otherwise, no determination is made (block 597).

2. System Overview

Figure 6:
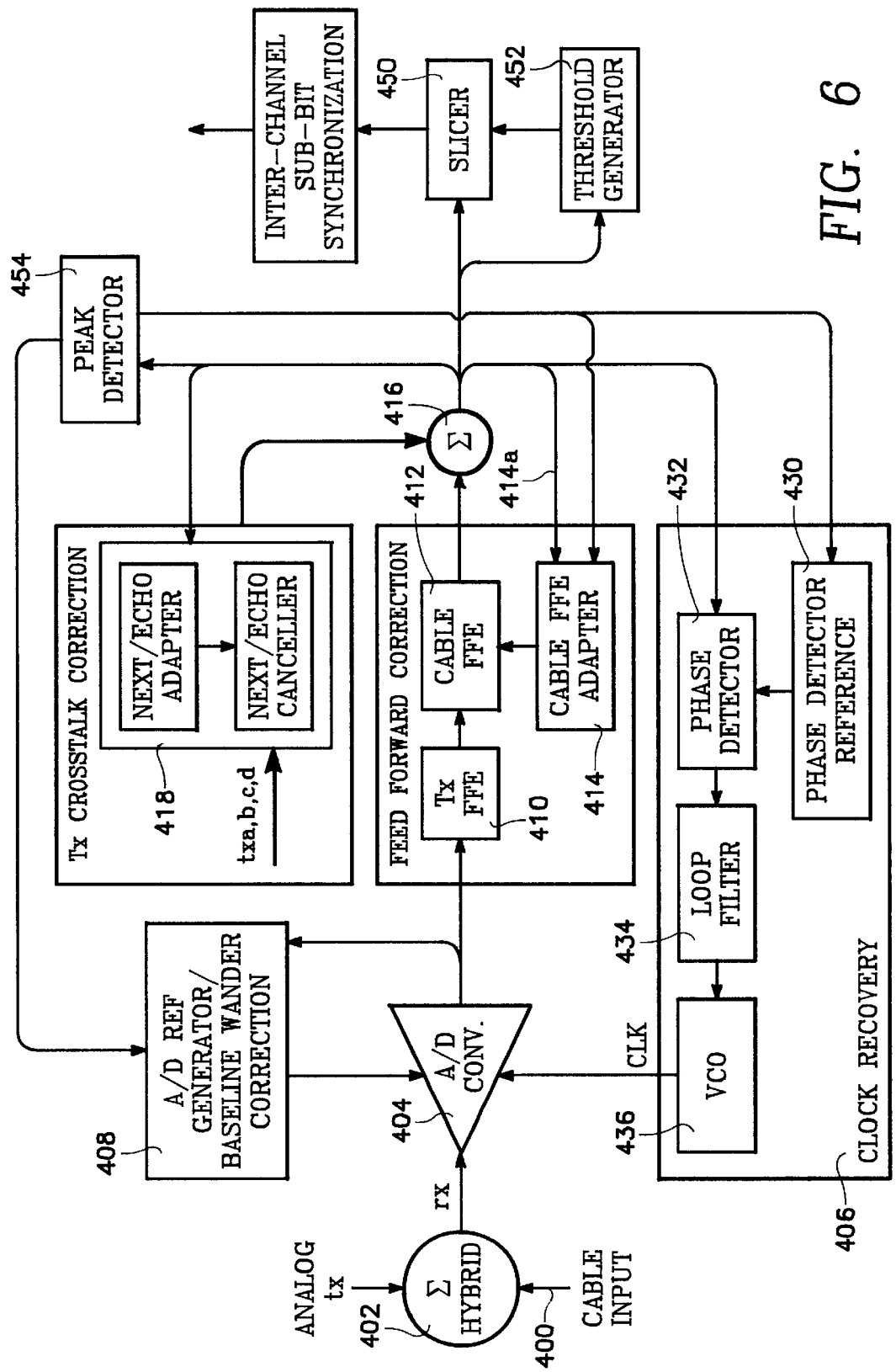
FIG. 6 is a block diagram illustrating a receiver system embodying the invention.

FIG. 6 illustrates a receiver that includes a phase detector embodying the present invention. The receiver communicates in a pulse amplitude modulation gigabit-per-second computer network. In such a system, the same cable (the cable 400 of FIG. 6) carries the transmitted and received signals simultaneously. Therefore, in order to isolate the received signal, an analog subtractor 402 subtracts the analog transmitted signal (the input labeled "analog tx") from the signal on the cable, producing the received signal ("rx") at the output of the subtractor 402. An analog-to-digital converter 404 samples the analog received signal rx in synchronism with a recovered clock signal produced by a clock recovery circuit 406. The analog-to-digital converter 404 converts each analog sample to a digital word (e.g., an eight-bit digital word) in accordance with an analog reference level from a conventional reference generator 408. The digital output of the analog-to-digital converter 404 is processed by a feed-forward equalizer 410 having a transfer function specified in accordance with industry standards to remove filtering imposed on the signal by the transmitter on the other side of the cable (the far end).

In order to compensate for distortions imposed on the received signal during its transit over the cable 400, such as those attributable to filtering effects of the cable discussed above in this specification, a cable feedforward equalizer 412 imposes a selected transfer function on the signal output by the equalizer 410. The equalizer 412 is of the conventional type whose transfer function may be represented in the complex plane with plural poles and zeroes corresponding to a desired frequency response. Preferably, the equalizer stores a number of such transfer functions, one of which may be selected at any one time. A cable feed forward equalizer adapter 414 chooses the best one of the transfer functions or settings of the cable feedforward equalizer 412.

The equalized digital signal produced by the cable feedforward equalizer 412 is combined in an adder 416 with a crosstalk correction signal produced by a crosstalk correction circuit 418. The crosstalk correction circuit 418 produces the crosstalk correction signal so as to compensate or cancel crosstalk from the transmitted signal when combined with the equalized digital signal in the adder 416. The crosstalk correction circuit has two inputs, namely the corrected signal from the output of the adder 416 and the transmitted signal tx, as indicated in FIG. 6. The crosstalk correction circuit-418 consists of a near end crosstalk ("NEXT")/echo canceller 420 and a NEXT/echo adapter 422 that controls the canceller 420. The crosstalk correction circuit 418 including the canceller 420 and the adapter 422 are described in U.S. patent application Ser. No. 09/636,047 entitled "ADAPTER FOR NEAR-END CROSSTALK AND ECHO CANCELLER FOR BI-DIRECTIONAL DIGITAL COMMUNICATIONS" filed Aug. 10, 2000, by Duy PHAM et al and U.S. patent application Ser. No. 09/636,042 filed Aug. 10, 2000, by Duy PHAM et al, both applications being assigned to the assignee of the present application, the disclosures of which are incorporated herein by reference.

The output of the adder 416 is fed back as an input to the crosstalk correction circuit 418, as referred to above, and to the cable feedforward adapter 414 at feedback input 414a. The receipt of the succession of samples of step 310 refers to the successive digitized samples furnished to the input 414a of the adapter 414. The adapter 414 chooses the best equalizer setting so as to maximize the number of digitized samples received at the input 414a falling within the three allowed levels discussed above.

The digital signal output by the adder 416 is also applied as a feedback signal to the clock recovery circuit 406, and specifically to a phase detector 432 which is the subject of the present application. The output of the phase detector 432 is applied to the input of a conventional loop filter 434 whose output controls a voltage controlled oscillator 436. The voltage controlled oscillator 436 generates the recovered clock signal applied to the analog-to-digital converter 404. The phase of the voltage controlled oscillator 436 is incremented or decremented depending upon the polarity of the phase error detected by the phase detector 432 in the manner described above with respect to FIGS. 4 and 5.

A conventional slicer 450 makes a decision for each digital sample as to which one of the allowed levels the sample represents (i.e., is closest to). It does this in accordance with a conventional threshold generator 452. It should be noted that during the training period of the equalizer adapter 414, 3-level pulse amplitude modulation is employed, but the actual data may be transmitted using a different number of levels, such as 5-level pulse amplitude modulation.

A peak detector 454 determines the prevailing or current peak amplitude (positive and negative) of the digital samples output by the adder 416. The positive and negative peak amplitudes define the upper and lower valid levels of the 3-level signal used during training of the adapter 414. In the example described above, the positive peak was 100, the negative peak was −100, defining the upper and lower valid levels, while the middle level between them was 0. The adapter 414 deduces the three valid levels of the 3-level pulse amplitude modulation signal by assigning the positive peak value sensed by the peak detector 454 to the upper valid level, the negative peak value sensed by the peak detector 454 to the lower valid level and the amplitude midway between the two peaks as the middle valid level. Conventional circuitry is employed to carry out this task.

The output of the peak detector 454 is also utilized in conventional well-known fashion by the conventional analog-to-digital reference generator 408. The reference generator 408 deduces from the peak magnitudes sensed by the detector 454 the current analog range of the incoming signal, and in conventional manner cause the maximum digital range of the analog-to-digital converter 404 to match the sensed analog range of the incoming signal.

The output of the peak detector 454 is also applied to a phase detector reference circuit 430 of the clock recovery circuit 406. The phase detector reference circuit 430 uses the peak magnitudes sensed by the peak detector 454 to deduce the allowable levels of the digitized signal at the output of the adder 416. The allowable levels thus deduced are then provided to the phase detector 432. The phase detector 432 compares each digital sample received from the adder 416 to the allowable levels provided by the phase detector reference circuit 430 in order to deduce the current phase error. This operation has been described above with reference to FIG. 6 and will now be elaborated upon with reference to the system of FIG. 6.

The peak detector 454 provides the phase detector reference circuit 430 the positive and negative peaks of the received signal. From these, the phase detector reference circuit deduces the three allowed levels of the signal and provides this information to the phase detector 432. The phase detector reference circuit is preferably dedicated hard-wired logic circuitry implemented using conventional design techniques to carry out the foregoing function. This function corresponds to the step of block 510 of FIG. 5.

The phase detector 432 establishes from the allowed signal levels the zero band 403 and the error band 405. In the examples discussed above, the zero band extended from 0 to about 10% of the maximum amplitude and the error band extended from 10% to 50% of the maximum amplitude. However, other selections for the width of these bands could be made. The zero and error bands are computed from the peak of the absolute value of the signal, but bands from other processed versions of the signal could be used, such as bands of the square of the signal, or the square root of the absolute value, or other non-linear processes of the signal that would increase the sensitivity to phase error.

The boundary between the error band and the zero band could be located at any amplitude between about 5% and 20% of the peak amplitude. These latter steps correspond to blocks 520 and 530 of FIG. 5. The phase detector 432 during each clock cycle stores the current sample from the adder 416 as well as the previous sample. It takes the absolute value (or square, or square root, or similarly suitable function of the absolute value, etc.) of those samples and then performs the steps of blocks 550 through 597. The phase detector may be a custom hardwired logic circuit designed to carry out those steps. The output of the phase detector 432 determines whether the phase of the voltage controlled oscillator 436 is decremented (block 595) or incremented (block 570) in accordance with the process of FIG. 5.

While the invention has been described in detail by specific reference to preferred embodiments, it is understood that variations and modifications thereof may be made without departing from the true spirit and scope of the invention.

What is claimed is:

1. A method for converting a multi-level analog signal having a symbol rate to a digital signal, comprising:
   sampling with a recovered clock a succession of samples of the analog signal at a sampling rate within an order of magnitude of the symbol rate of the analog signal, and converting a current sample to a digital word;
   determining from peak values of the analog signal at least two allowable levels of the analog signal including a reference-crossing level;
   defining a zero band of amplitude ranges of the analog signal including the reference-crossing level;
   defining an error band of amplitude ranges of the analog signal extending from said zero band to a fraction of the amplitude of the next allowable level;
   for a pair of successive samples of the analog signal comprising a current sample and a prior sample:
   (a) if the current and prior samples fall within the error and zero bands respectively, returning a negative phase error input to a phase correction feedback control loop controlling the phase of the recovered clock,
   (b) if the current and prior samples fall within the zero and error bands respectively, returning a positive phase error input to the phase correction feedback control loop.

2. The method of claim 1 wherein the step of returning a negative phase error input is followed by the phase correction feedback control loop incrementing the phase of the recovered clock.

3. The method of claim 1 wherein the step of returning a positive phase error input is followed by the phase correction feedback control loop decrementing the phase of the recovered clock.

4. The method of claim 1 wherein there are three allowable levels determined by the determining step symmetrically disposed about zero amplitude, the method further comprising:
   taking the absolute value of each of said samples, whereby said pair of successive samples are absolute values of the analog signal.

5. The method of claim 4 wherein said reference crossing level is zero amplitude and is a zero-crossing level.

6. The method of claim 1 wherein there are three allowable levels determined by the determining step symmetrically disposed about zero amplitude, the method further comprising:
   taking the square of each of said samples, whereby said pair of successive samples are squares of the analog signal.

7. The method of claim 1 wherein there are three allowable levels determined by the determining step symmetrically disposed about zero amplitude, the method further comprising:
   taking the square root of the absolute value of each of said samples, whereby said pair of successive samples are square roots of the analog signal.

8. The method of claim 1 wherein there are three allowable levels determined by the determining step symmetrically disposed about zero amplitude, the method further comprising:
   computing non-linear functions of said samples, whereby said pair of successive samples are non-linear functions of the analog signal.

9. The method of claim 1 further comprising:
   if neither or both of the pair of samples are in the error band, withholding determination of phase error.

10. The method of claim 1 wherein there are three allowable levels determined by the determining step symmetrically disposed about and including zero amplitude, and wherein:
    said zero band extends from zero amplitude to a small percentage of an other one of the allowable levels
    said error band extends up to 50% of the other allowable level.

11. The method of claim 10 wherein said zero band extends down from the peak by a relatively small percentage.

12. The method of claim 10 wherein said error band extends from the bottom of said zero band down to the point midway between the highest level and a next lower level.

13. The method of claim 10 wherein said reference crossing level is zero amplitude and is a zero-crossing level.

14. The method of claim 10 wherein said small percentage is on the order of 10%.

15. The method of claim 1 wherein said sampling rate is at least approximately equal to said symbol rate.

16. The method of claim 15 wherein said multi-level analog signal is a pulse amplitude modulated signal, whereby said sampling rate corresponds at least approximately to one sample for each edge (or baud) of said analog signal.

17. A method for detecting a phase error between a local clock signal from a multi-level analog signal, comprising:
    sampling by a recovered clock a succession of samples of the analog signal;
    determining from the analog signal at least two allowable levels of the analog signal including a reference-crossing level;
    defining a zero band of amplitude ranges of the analog signal including the reference-crossing level;
    defining an error band of amplitude ranges of the analog signal extending from said zero band to a fraction of the amplitude of a next allowable level;
    for a pair of successive samples of the analog signal comprising a current sample and a prior sample:
    (a) if the current and prior samples fall within the error and zero bands respectively, returning a negative phase error,
    (b) if the current and prior samples fall within the zero and error bands respectively, returning a positive phase error.

18. The method of claim 17 wherein the step of returning a negative phase error input is followed by the phase correction feedback control loop incrementing the phase of the recovered clock.

19. The method of claim 18 wherein said sampling rate is on the order of magnitude of a symbol rate of said analog signal.

20. The method of claim 19 wherein said sampling rate is at least approximately equal to said symbol rate.

21. The method of claim 19 wherein said multi-level analog signal is a pulse amplitude modulated signal, whereby said sampling rate corresponds at least approximately to one sample for each edge of said analog signal.

22. The method of claim 17 wherein the step of returning a positive phase error input is followed by the phase correction feedback control loop decrementing the phase of the recovered clock.

23. The method of claim 17 wherein there are three allowable levels determined by the determining step symmetrically disposed about zero amplitude, the method further comprising:
taking the absolute value of each of said samples, whereby said pair of successive samples are absolute values of the analog signal.

24. The method of claim 23 wherein said reference crossing level is zero amplitude and is a zero-crossing level.

25. The method of claim 17 wherein there are three allowable levels determined by the determining step symmetrically disposed about zero amplitude, the method further comprising:
taking the square of each of said samples, whereby said pair if successive samples are squares of the analog signal.

26. The method of claim 17 wherein there are three allowable levels determined by the determining step symmetrically disposed about zero amplitude, the method further comprising:
taking the square root of the absolute value of each of said samples, whereby said pair of successive samples are square roots of the analog signal.

27. The method of claim 17 wherein there are three allowable levels determined by the determining step symmetrically disposed about zero amplitude, the method further comprising:
computing non-linear functions if said samples, whereby said pair of successive samples are non-linear functions of the analog signal.

28. The method of claim 17 further comprising:
if neither or both of the pair of samples are in the error band, withholding determination of phase error.

29. The method of claim 17 wherein there are three allowable levels determined by the determining step symmetrically disposed about and including zero amplitude, and wherein:
said zero band extends from zero amplitude to a small percentage of an other one of the allowable levels
said error band extends up to 50% of the other allowable level.

30. The method of claim 29 wherein said zero bands extends down from the peak by a relatively small percentage.

31. The method of claim 29 wherein said error band extends from the bottom of said zero band down to the point midway between the highest level and a next lower level.

32. The method of claim 29 wherein said reference crossing level is zero amplitude and is a zero-crossing level.

33. The method of claim 29 wherein said small percentage is on the order of 10%.

34. Apparatus for converting a multi-level analog signal having a symbol rate to a digital signal, comprising:

an analog-to-digital converter for sampling by a recovered clock a succession of samples of the analog signal at a sampling rate within an order of magnitude of the symbol rate of the analog signal, and converting a current sample to a digital word;

a phase detector reference circuit for:
(a) determining from peak values of the analog signal at least two allowable levels of the analog signal including a reference-crossing level,
(b) defining a zero band of amplitude ranges of the analog signal including the reference-crossing level,
(c) defining an error band of amplitude ranges of the analog signal extending from said zero band to a fraction of the amplitude of the next allowable level;

a phase detector for inferring a phase error for each pair of successive samples of the analog signal, said phase detector comprising:
(a) means responsive whenever the current and prior samples fall within the error and zero bands respectively, for returning a negative phase error input to a phase correction input controlling the phase of the recovered clock,
(b) means responsive whenever the current and prior samples fall within the zero and error bands respectively, for returning a positive phase error input to the phase correction input.

35. The apparatus of claim 34 wherein there are three allowable levels symmetrically disposed about zero amplitude, the apparatus further comprising:
means for taking the absolute value of each of said samples, whereby said pair of successive samples are absolute values of the analog signal.

36. The apparatus of claim 35 wherein said reference crossing level is zero amplitude and is a zero-crossing level.

37. The apparatus of claim 36 wherein there are three allowable levels symmetrically disposed about and including zero amplitude, and wherein:
said zero band extends from zero amplitude to a small percentage of an other one of the allowable levels
said error band extends up to 50% of the other allowable level.

38. The apparatus of claim 37 wherein said reference crossing level is zero amplitude and is a zero-crossing level.

39. The apparatus of claim 38 wherein said small percentage is on the order of 10%.

40. The method of claim 34 wherein there are three allowable levels determined by the determining step symmetrically disposed about zero amplitude, the method further comprising:
taking the square of each of said samples, whereby said pair of successive samples are squares of the analog signal.

41. The method of claim 34 wherein there are three allowable levels determined by the determining step symmetrically disposed about zero amplitude, the method further comprising:
taking the square root of the absolute value of each of said samples, whereby said pair if successive samples are square roots of the analog signal.

42. The method of claim 34 wherein there are three allowable levels determined by the determining step symmetrically disposed about zero amplitude, the method further comprising:
computing non-linear functions of said samples, whereby said pair of successive samples are non-linear functions of the analog signal.

43. The apparatus of claim 34 wherein said sampling rate is at least approximately equal to said symbol rate.

44. The method of claim 43 wherein said multi-level analog signal is a pulse amplitude modulated signal, whereby said sampling rate corresponds at least approximately to one sample for each edge of said analog signal.

* * * * *